United States Patent
Chen et al.

(10) Patent No.: US 9,576,901 B1
(45) Date of Patent: Feb. 21, 2017

(54) CONTACT AREA STRUCTURE AND METHOD FOR MANUFACTURING THE SAME

(71) Applicant: International Business Machines Corporation, Armonk, NY (US)

(72) Inventors: Hsueh-Chung Chen, Cohoes, NY (US); Su Chen Fan, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/053,106

(22) Filed: Feb. 25, 2016

(51) Int. Cl.
| | |
|---|---|
| *H01L 21/44* | (2006.01) |
| *H01L 23/528* | (2006.01) |
| *H01L 21/768* | (2006.01) |
| *H01L 23/522* | (2006.01) |
| *H01L 23/532* | (2006.01) |

(52) U.S. Cl.
CPC ........ *H01L 23/528* (2013.01); *H01L 21/7684* (2013.01); *H01L 21/76811* (2013.01); *H01L 21/76816* (2013.01); *H01L 21/76846* (2013.01); *H01L 21/76849* (2013.01); *H01L 21/76879* (2013.01); *H01L 23/5226* (2013.01); *H01L 23/53266* (2013.01)

(58) Field of Classification Search
CPC ............. H01L 23/481; H01L 21/76898; H01L 21/76849; H01L 23/5226; H01L 21/76843; H01L 23/528; H01L 23/53295; H01L 23/485
See application file for complete search history.

(56) References Cited

U.S. PATENT DOCUMENTS

| | | | |
|---|---|---|---|
| 7,064,064 B2 * | 6/2006 | Chen ................. | H01L 21/76834 257/E21.576 |
| 8,080,475 B2 * | 12/2011 | RamachandraRao et al. ................. | H01L 21/02063 257/E21.219 |
| 8,299,365 B2 * | 10/2012 | Nguyen ............ | H01L 21/76846 174/256 |
| 8,524,600 B2 | 9/2013 | Lei et al. | |
| 2006/0286797 A1 * | 12/2006 | Zhang ............... | H01L 21/76856 438/659 |
| 2009/0004850 A1 | 1/2009 | Ganguli et al. | |

(Continued)

OTHER PUBLICATIONS

X. Miao et al., "An Analytical Metal Resistance Model and Its Application for Sub-22-nm Metal-Gate CMOS," IEEE Electron Device Letters, Apr. 2015, pp. 384-386, vol. 36, No. 4.

(Continued)

*Primary Examiner* — Roy Potter
(74) *Attorney, Agent, or Firm* — Vazken Alexanian; Ryan, Mason & Lewis, LLP

(57) ABSTRACT

A method for manufacturing a semiconductor device includes forming a contact area opening in a dielectric structure, depositing a contact area metal in the contact area opening, forming a metal cap layer on the contact area metal, forming one or more dielectric layers on the metal cap layer, forming one or more hard mask layers on the one or more dielectric layers, forming a metallization opening through the one or more dielectric and hard mask layers, wherein the metallization opening exposes the metal cap layer, removing the one or more hard mask layers, and forming a metallization layer in the metallization opening on the metal cap layer.

18 Claims, 13 Drawing Sheets

(56) References Cited

U.S. PATENT DOCUMENTS

| | | |
|---|---|---|
| 2013/0260555 A1 | 10/2013 | Zope et al. |
| 2013/0320541 A1 | 12/2013 | Chang et al. |
| 2014/0183738 A1 | 7/2014 | Jezewski et al. |
| 2014/0264872 A1 | 9/2014 | Lin et al. |
| 2015/0021672 A1 | 1/2015 | Chuang et al. |
| 2015/0133293 A1 | 5/2015 | Khodadadi et al. |
| 2015/0235957 A1 | 8/2015 | Zhang et al. |

OTHER PUBLICATIONS

Wikipedia, "Standard Electrode Potential," https://en.wikipedia.org/wiki/Standard_electrode_potential, Feb. 14, 2016, 3 pages.

* cited by examiner

CONTACT AREA STRUCTURE AND METHOD FOR MANUFACTURING THE SAME

TECHNICAL FIELD

The field generally relates to semiconductor devices and methods of manufacturing same and, in particular, to semiconductor devices having an improved contact area structure.

BACKGROUND

During semiconductor integrated circuit processing dielectric and hard mask layers are removed to pattern openings for metallization levels for back end of line (BEOL) integrated circuit structures in a semiconductor device. During hard mask removal after the patterning, exposed portions of contact areas in the openings that would be positioned below the resulting metallization layers are undesirably eroded and/or removed. For example, portions of tungsten or cobalt contact areas are undesirably eroded and/or removed during a hard mask removal process that is performed using a wet etch.

Accordingly, there is a need to prevent unwanted erosion and/or removal of contact area portions that occurs during processing to form metallization levels.

SUMMARY

According to an exemplary embodiment of the present invention, a method for manufacturing a semiconductor device includes forming a contact area opening in a dielectric structure, depositing a contact area metal in the contact area opening, forming a metal cap layer on the contact area metal, forming one or more dielectric layers on the metal cap layer, forming one or more hard mask layers on the one or more dielectric layers, forming a metallization opening through the one or more dielectric and hard mask layers, wherein the metallization opening exposes the metal cap layer, removing the one or more hard mask layers, and forming a metallization layer in the metallization opening on the metal cap layer.

According to an exemplary embodiment of the present invention, a semiconductor device includes a contact area opening in a dielectric structure, a contact area metal formed in the contact area opening, a metal cap layer on the contact area metal, one or more dielectric layers on the dielectric structure, a metallization opening formed through the one or more dielectric layers, wherein the metallization opening extends to the metal cap layer, and a metallization layer in the metallization opening contacting the metal cap layer.

According to an exemplary embodiment of the present invention, a method for manufacturing a semiconductor device includes forming a plurality of contact area openings in a dielectric structure, depositing a contact area metal in each of the contact area openings, forming a metal cap layer on each of the contact area metals, forming one or more dielectric layers on the metal cap layers, forming one or more hard mask layers on the one or more dielectric layers, forming a plurality of metallization openings through the one or more dielectric and hard mask layers, wherein the metallization openings expose each of the metal cap layers, removing the one or more hard mask layers, and forming a metallization layer in each of the metallization openings on the metal cap layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
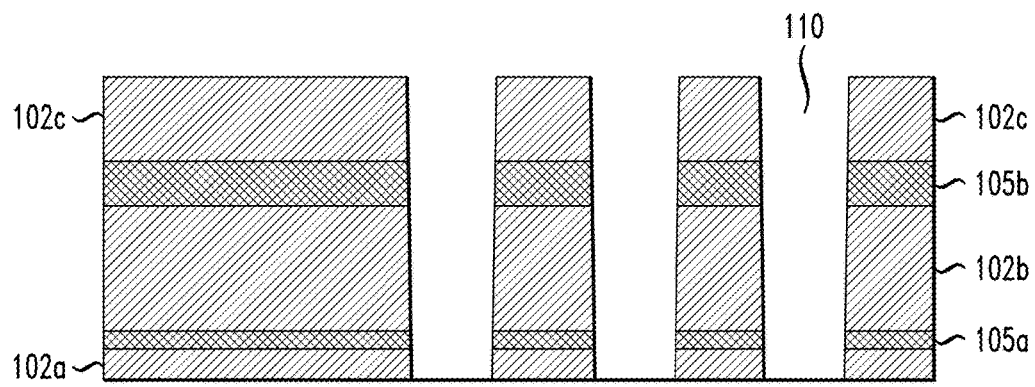
FIG. 1 is a cross-sectional view illustrating removal of portions of stacked dielectric layers to form contact area openings in a method of manufacturing a semiconductor device, according to an exemplary embodiment of the present invention.

Exemplary embodiments of the invention will now be discussed in further detail with regard to semiconductor devices and methods of manufacturing same and, in particular, to semiconductor devices having an improved contact area structure.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), dynamic random-access memory (DRAM), programmable logic devices (PLDs), programmable gate arrays, programmable read-only memory (PROM) devices, including, but not limited to, erasable programmable read-only memories (EPROMS), electronically erasable programmable read-only memories (EEPROMS), and/or other semiconductor devices in which low resistance contacts may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, DRAMs, PLDs, programmable gate arrays, PROMS, EPROMS, and/or EEPROMS. By way of non-limiting example, the semiconductor devices can include, but are not limited to CMOS, MOSFET, FinFET, DRAM, PLD, programmable gate array, PROM, EPROM, and EEPROM devices, and/or semiconductor devices that use CMOS, MOSFET, FinFET, DRAM, PLD, programmable gate array, PROM, EPROM, and/or EEPROM technology.

As used herein, "vertical" refers to a direction perpendicular to a substrate in the cross-sectional views.

As used herein, "horizontal" refers to a direction parallel to a substrate in the cross-sectional views.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the cross-sectional views.

As used herein, "width" or "length" refers to a size of an element (e.g., a layer, trench, hole, etc.) in the figures measured from a side surface to an opposite surface of the element.

Unlike conventional structures, the improved contact area structure, according to an embodiment of the present invention, provides desirable resistivity values and protection against unwanted erosion and/or removal of contact area portions while forming metallization layers.

FIG. 1 is a cross-sectional view illustrating removal of portions of stacked dielectric layers to form contact area openings in a method of manufacturing a semiconductor device, according to an exemplary embodiment of the present invention. Referring to FIG. 1, a plurality of dielectric layers are formed in a stacked configuration including first, second and third oxide layers 102a, 102b and 102c (e.g., silicon oxide (SiO2)) alternately stacked with first and second nitride layers 105a and 105b (e.g., silicon nitride (SiN)). According to an embodiment, the stacked configuration of dielectric layers 102 and 105 is formed on a semiconductor substrate (not shown) that includes a semiconductor material including, but not limited to, Si, SiGe, SiC, SiGeC or other like semiconductor. In addition, multiple layers of the semiconductor materials can be used as the semiconductor material of the semiconductor substrate.

As shown in FIG. 1, the openings 110 are formed through select portions of each of the layers 102a-c and 105a-b, and can be patterned by a removal process, such as etching, including, for example, lithography. According to an embodiment of the present invention, lithography patterning is transferred to a hard mask by a reactive ion etching (RIE) process. It is to be understood that the invention is not necessarily limited to the illustrated stacked configuration, and that more or less stacked dielectric layers, and different dielectric materials may be used. In addition, the invention is not necessarily limited to the illustrated number of contact area openings, and more or less contact area openings can be formed. In an alternative embodiment, the contact area openings are formed through a single dielectric layer.

Figure 2:
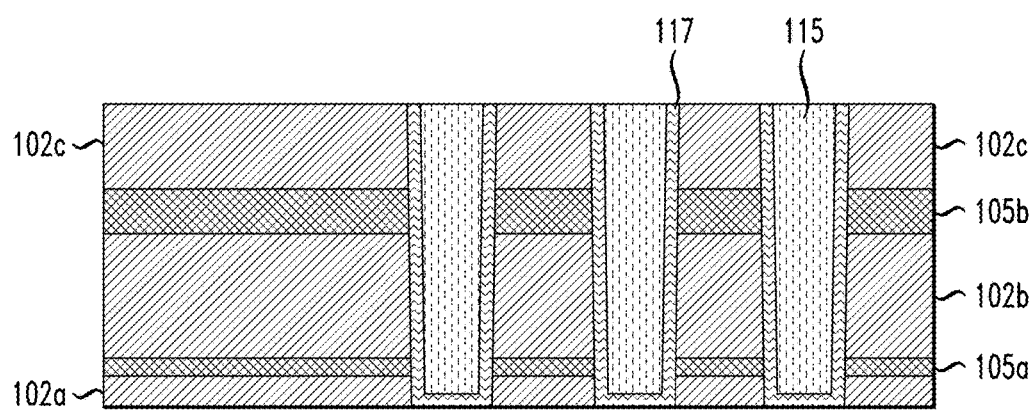
FIG. 2 is a cross-sectional view illustrating deposition of a barrier film and contact area metal to form contact areas in a method of manufacturing a semiconductor device, according to an exemplary embodiment of the present invention.

FIG. 2 is a cross-sectional view illustrating deposition of a barrier film and contact area metal to form contact areas in a method of manufacturing a semiconductor device, according to an exemplary embodiment of the present invention. Referring to FIG. 2, the openings 110 (can also be referred to as trenches or vias) are filled with a contact area metal 115, such as, for example, tungsten (W), cobalt (Co) or copper (Cu). Prior to deposition of the contact area metal, the opening 110 is lined on sides and a bottom thereof with a barrier film 117, which surrounds the contact area metal 115 once the contact area metal 115 is deposited. The barrier film 117 can include, but is not necessarily limited to, titanium (Ti) or titanium nitride (TiN). The contact area metal 115 and barrier film 117 can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition, and/or liquid source misted chemical deposition (LSMCD), sputtering, and/or plating, followed by a planarization process, such as, chemical mechanical planarization (CMP) to remove excess contact area metal and barrier film materials. Referring to FIG. 2, the resulting structure has a planarized top surface.

Figure 3:
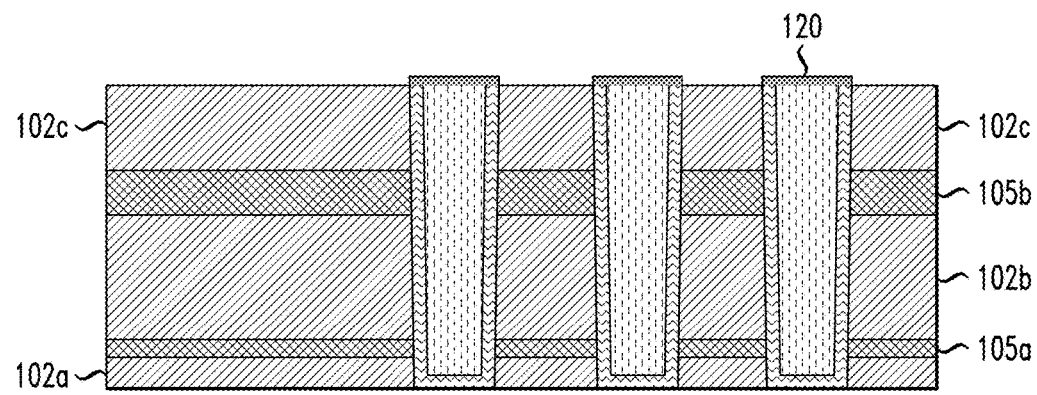
FIG. 3 is a cross-sectional view illustrating deposition of a metal cap layer on each contact area in a method of manufacturing a semiconductor device, according to an exemplary embodiment of the present invention.

FIG. 3 is a cross-sectional view illustrating deposition of a metal cap layer on each contact area in a method of manufacturing a semiconductor device, according to an exemplary embodiment of the present invention. Referring to FIG. 3, a metal cap layer 120 is selectively deposited on each contact area including the contact area metal 115 and barrier film 117. The selective deposition is performed using, for example, CVD. According to an embodiment, if the contact area metal 115 is cobalt, the metal cap layer 120 comprises ruthenium (Ru), for example, CVD-Ru, and if the contact area metal 115 comprises tungsten, the metal cap layer 120 comprises cobalt, for example, CVD-Co. A height of a metal cap layer 120 with respect to the surface on which it is deposited can be in the range of about 3 nm to about 15 nm. As an alternative to CVD, other deposition techniques including, but not limited to, PECVD, RFCVD, PVD, ALD, MBD, pulsed laser deposition, and/or LSMCD, sputtering, and/or plating can also be used to deposit the metal cap layers 120. In alternative embodiments, a metal cap layer comprising ruthenium or cobalt can be deposited on a copper contact area metal, and a metal cap layer comprising nickel can be deposited on a tungsten or copper contact area metal. The combination of the metal cap layer and the contact are metal can be referred to herein as a "hybrid metal cell." The hybrid metal cell results in a relatively low resistance contact in a semiconductor structure, such as, for example, a dual damascene structure. In accordance with an embodiment of the present invention, a planarization process, such as, CMP is not needed after deposition of the metal cap layer 120.

Figure 4:
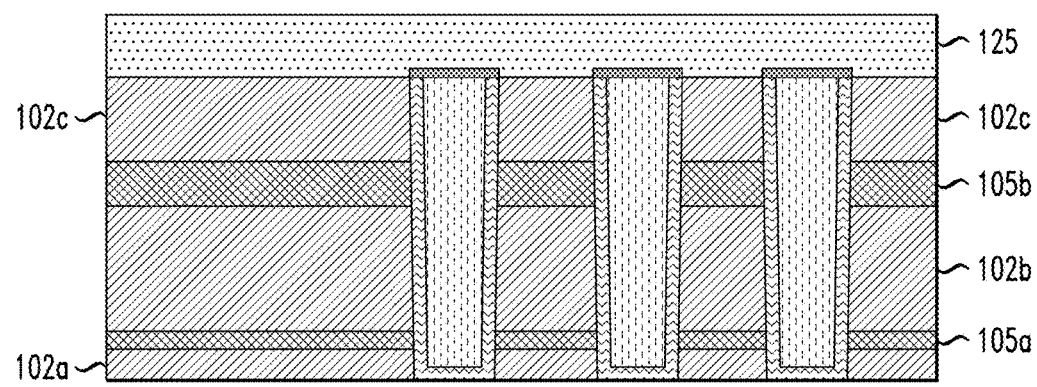
FIG. 4 is a cross-sectional view illustrating deposition of a dielectric layer on the structure including the metal cap layers of FIG. 3 in a method of manufacturing a semiconductor device, according to an exemplary embodiment of the present invention.

FIG. 4 is a cross-sectional view illustrating deposition of a dielectric layer on the structure including the metal cap layers of FIG. 3 in a method of manufacturing a semiconductor device, according to an exemplary embodiment of the present invention. Referring to FIG. 4, following deposition of the metal cap layers 120, an interlayer dielectric layer 125 is deposited using deposition techniques including, but not limited to, CVD, PECVD, RFCVD, PVD, ALD, MBD, pulsed laser deposition, and/or LSMCD, sputtering, and/or plating. According to an embodiment, the interlayer dielectric layer 125 includes NBLoK ($SiC_xN_yH_z$), or other suitable back end of line (BEOL) low-k dielectric, such as silicon-borocarbonitride (SiBCN) or siliconoxycarbonitride (SiOCN).

Figure 5:
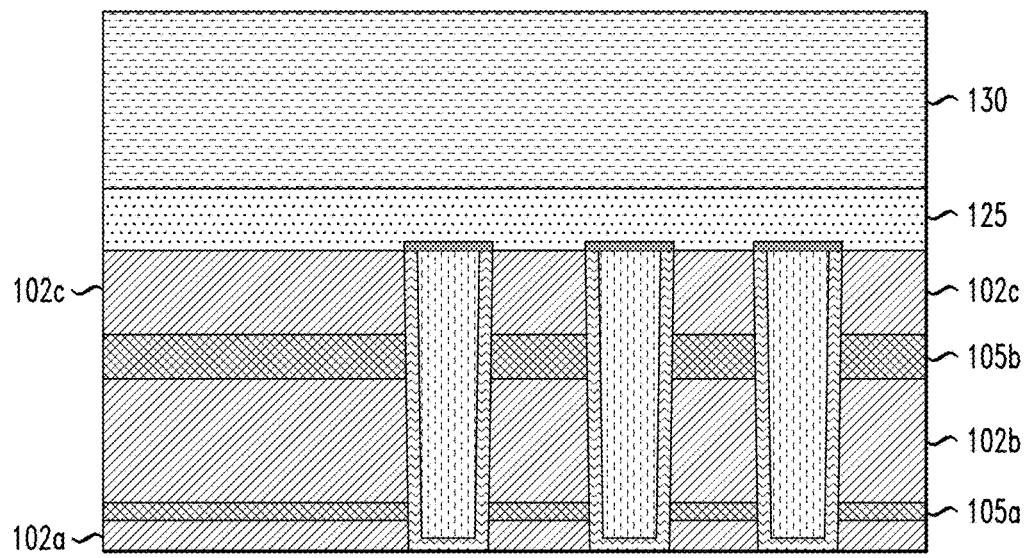
FIG. 5 is a cross-sectional view illustrating deposition of another dielectric layer on the structure including the dielectric layer of FIG. 4 in a method of manufacturing a semiconductor device, according to an exemplary embodiment of the present invention.

FIG. 5 is a cross-sectional view illustrating deposition of another dielectric layer on the structure including the dielectric layer of FIG. 4 in a method of manufacturing a semiconductor device, according to an exemplary embodiment of the present invention. Referring to FIG. 5, another interlayer dielectric layer 130 is deposited on interlayer dielectric layer 125 using deposition techniques including, but not limited to, CVD, PECVD, RFCVD, PVD, ALD, MBD, pulsed laser deposition, and/or LSMCD, sputtering, and/or plating. According to an embodiment, the other interlayer dielectric layer 130 includes OctaMethylCycloTetraSiloxane (OMCTS) ($[(CH_3)_2SiO-]_4$), or other suitable BEOL low-k dielectric, such as SiLK® dielectric, available from Dow Chemical Company of Midland, Mich.

Figure 6:
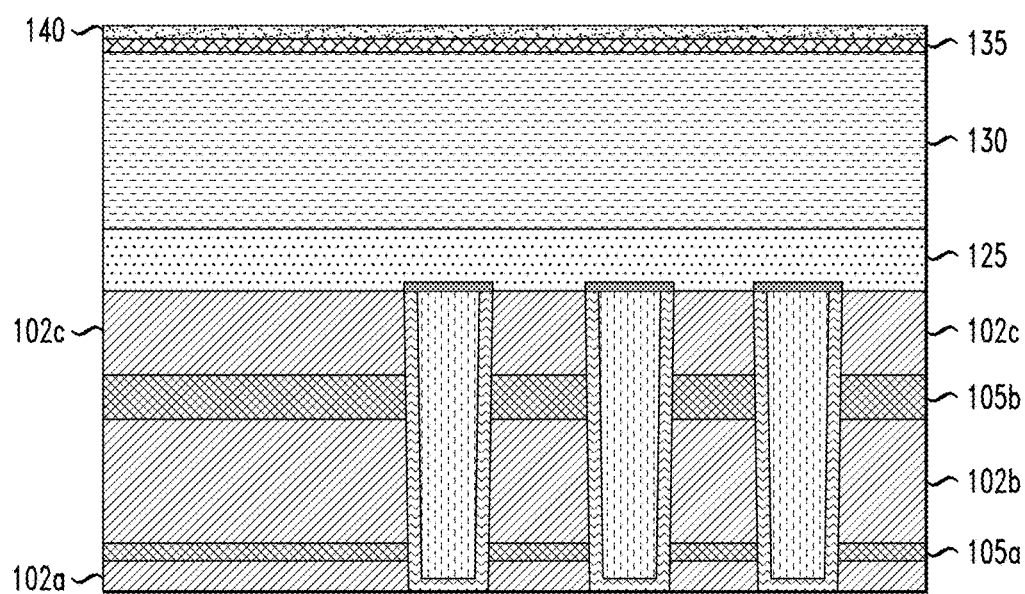
FIG. 6 is a cross-sectional view illustrating deposition of hard mask layers on the structure including the dielectric layers of FIG. 5 in a method of manufacturing a semiconductor device, according to an exemplary embodiment of the present invention.

FIG. 6 is a cross-sectional view illustrating deposition of hard mask layers on the structure including the dielectric layers of FIG. 5 in a method of manufacturing a semiconductor device, according to an exemplary embodiment of the present invention. Referring to FIG. 6, first and second hard mask layers 135 and 140 are deposited using deposition techniques including, but not limited to, CVD, PECVD, RFCVD, PVD, ALD, MBD, pulsed laser deposition, and/or LSMCD, sputtering, and/or plating. According to an embodiment, the hard mask layer 135 includes silicon nitride (SiN), and the hard mask layer 140 includes titanium nitride (TiN).

Figure 7:
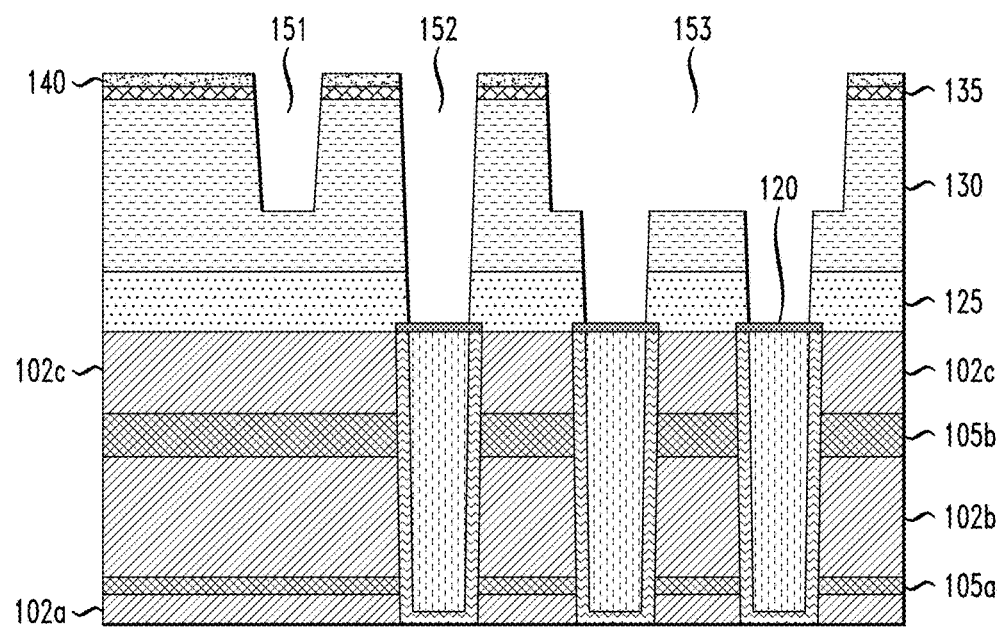
FIG. 7 is a cross-sectional view illustrating formation of openings for a metallization layer in a method of manufacturing a semiconductor device, according to an exemplary embodiment of the present invention.

FIG. 7 is a cross-sectional view illustrating formation of openings for a metallization layer in a method of manufacturing a semiconductor device, according to an exemplary embodiment of the present invention. Referring to FIG. 7, openings 152 and 153 are formed through the layers 125, 130, 135 and 140, exposing the metal cap layers 120. Opening 151 is formed through the layers 135 and 140, and partially through the layer 130. The openings 151, 152 and 153 are patterned using, for example a lithography and RIE process as described above. Patterning of the openings 152 and 153 leaves the metal cap layers 120 exposed during subsequent processing to remove the hard masks 135 and 140. In accordance with an embodiment of the present invention, the presence of the metal cap layers 120 on the contact area metal layers 115 prevents unwanted erosion and/or removal of the contact area metal 115 during removal of the hard mask layers 135, 140, and, in particular, during a wet etch process used to remove the TiN hard mask layer 140. The presence of the metal cap layers 120 on the barrier films 117 can also prevent unwanted erosion and/or removal of the barrier films 117 during removal of the hard mask layers 135, 140.

Figure 8:
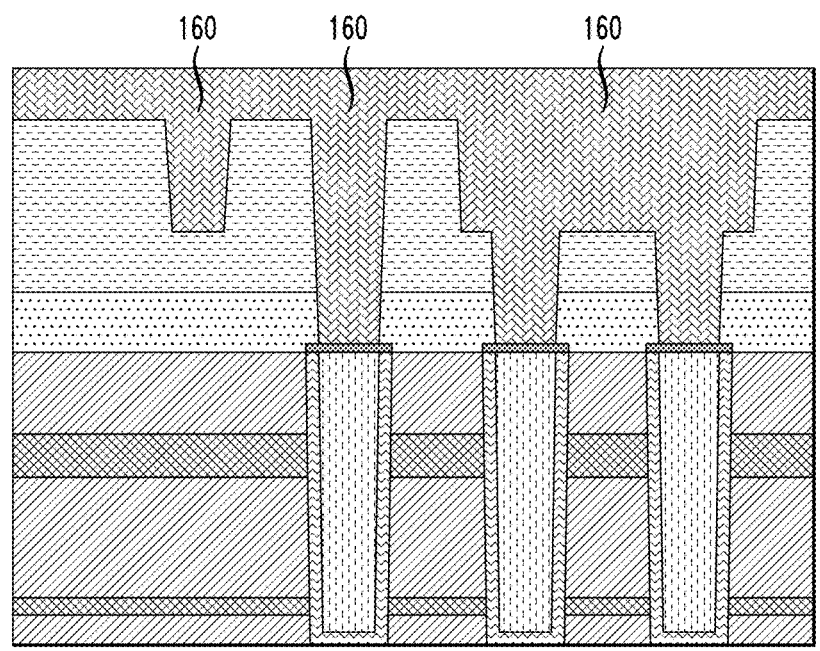
FIG. 8 is a cross-sectional view illustrating deposition of a metallization layer in a method of manufacturing a semiconductor device, according to an exemplary embodiment of the present invention.

FIG. 8 is a cross-sectional view illustrating deposition of a metallization layer in a method of manufacturing a semiconductor device, according to an exemplary embodiment of the present invention. Referring to FIG. 8, after removing the hard masks 135 and 140, the metallization layer 160 is deposited using deposition techniques including, but not limited to, CVD, PECVD, RFCVD, PVD, ALD, MBD, pulsed laser deposition, and/or LSMCD, sputtering, and/or plating. According to an embodiment, the metallization layer 160 includes, but is not necessarily limited to, aluminum, nickel, chromium, gold, germanium, copper, silver, titanium, tungsten, platinum, and/or tantalum. Selected metal alloys may also be used as the metallization layer 160.

Figure 9:
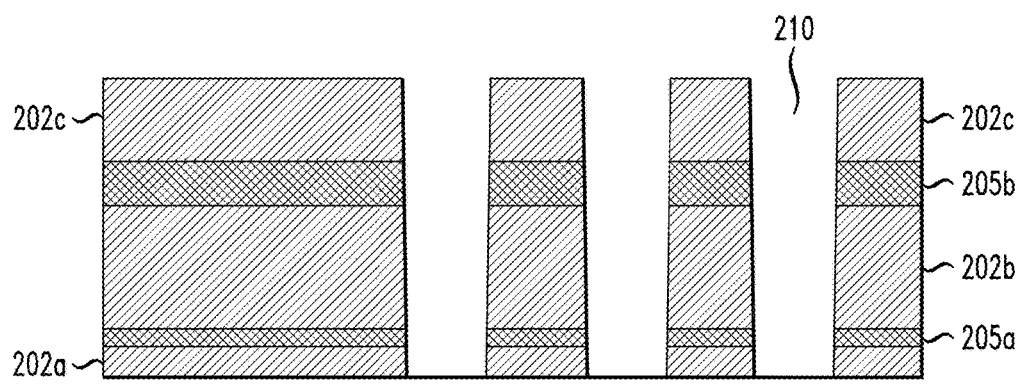
FIG. 9 is a cross-sectional view illustrating removal of portions of stacked dielectric layers to form contact area openings in a method of manufacturing a semiconductor device, according to an exemplary embodiment of the present invention.
Figure 10:
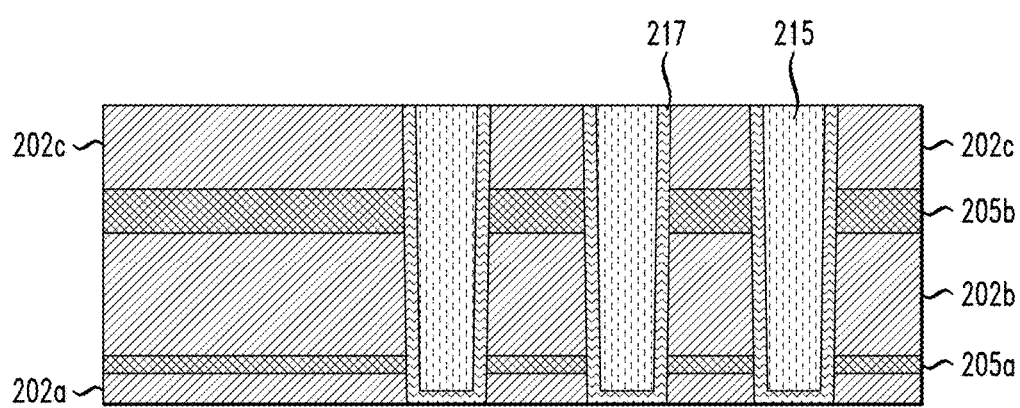
FIG. 10 is a cross-sectional view illustrating deposition of a barrier film and contact area metal to form contact areas in a method of manufacturing a semiconductor device, according to an exemplary embodiment of the present invention.

FIG. 9 is a cross-sectional view illustrating removal of portions of stacked dielectric layers to form contact area openings, and FIG. 10 is a cross-sectional view illustrating deposition of a barrier film and contact area metal to form contact areas in a method of manufacturing a semiconductor device, according to an exemplary embodiment of the present invention. FIGS. 9 and 10 illustrate the same or similar steps as those described in connection with FIGS. 1 and 2, and an explanation of same is not repeated herein. The same or similar reference numbers as those in previous figures are used to denote the same or similar features, elements, or structures as described in connection with the previous figures.

Figure 11:
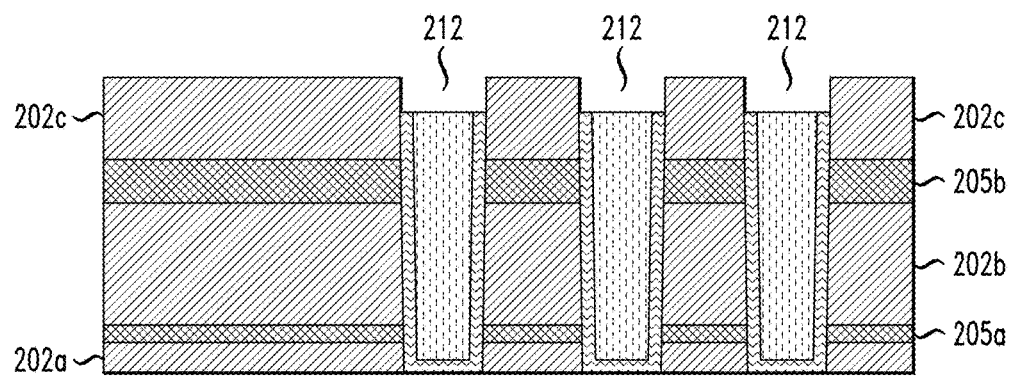
FIG. 11 is a cross-sectional view illustrating recessing of each contact area in a method of manufacturing a semiconductor device, according to an exemplary embodiment of the present invention.

FIG. 11 is a cross-sectional view illustrating recessing of each contact area in a method of manufacturing a semiconductor device, according to an exemplary embodiment of the present invention. Referring to FIG. 11, the contact area metal 215 and the barrier film 217 of each contact area are recessed below the top surface of the uppermost oxide layer 202c to create recessed areas 212. The recessing can be performed using, for example, an isotropic etch, such as a wet chemical etch, or an anisotropic etch, such as reactive ion etching (RIE), ion beam etching, plasma etching or laser ablation to remove the contact area metal 215 and the barrier film 217 from an upper portion of the contact area opening 210. A depth of the recessed portion 212 from the top surface of the oxide layer 202c can be for example about 3 nm to about 10 nm.

Figure 12:
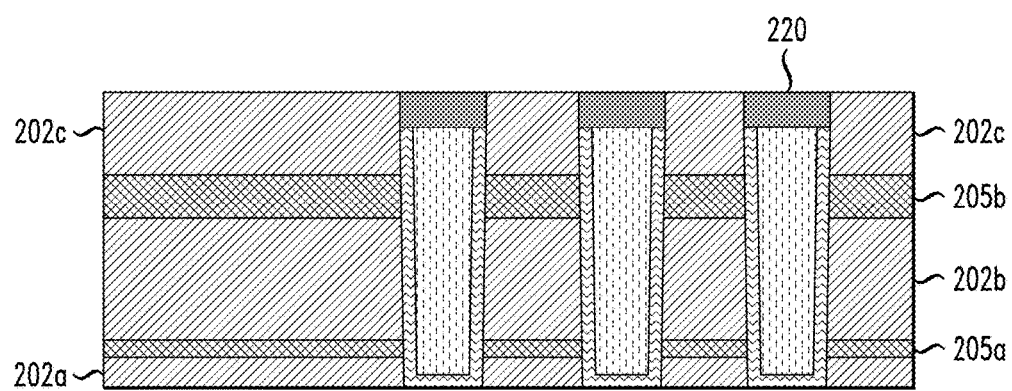
FIG. 12 is a cross-sectional view illustrating deposition of a recessed metal cap layer on each recessed contact area in a method of manufacturing a semiconductor device, according to an exemplary embodiment of the present invention.

FIG. 12 is a cross-sectional view illustrating deposition of a recessed metal cap layer on each recessed contact area in a method of manufacturing a semiconductor device, according to an exemplary embodiment of the present invention.

Referring to FIG. 12, a recessed metal cap layer 220 is selectively deposited on each contact area including the contact area metal 215 and barrier film 217. The selective deposition is performed using, for example, CVD as described above in connection with FIG. 3. According to an embodiment, if the contact area metal 215 is cobalt, the metal cap layer 220 comprises ruthenium (Ru), for example, CVD-Ru, and if the contact area metal 215 comprises tungsten, the metal cap layer 220 comprises cobalt, for example, CVD-Co. A height of a metal cap layer 220 with respect to the surface on which it is deposited can be in the range of about 3 nm to about 15 nm. In the case of a height of the metal cap layer 220 that is less than or equal to the depth of the recess 212, a top surface of the metal cap layer 220 will remain at or below a top surface of the oxide layer 202c. In the case of a height of the metal cap layer 220 that is greater than the depth of the recess 212, a top surface of the metal cap layer 220 will be positioned above a top surface of the oxide layer 202c. As an alternative to CVD, other deposition techniques including, but not limited to, PECVD, RFCVD, PVD, ALD, MBD, pulsed laser deposition, and/or LSMCD, sputtering, and/or plating can also be used to deposit the metal cap layers 220. Similar to the metal cap layer described in connection with FIG. 3, in alternative embodiments, a metal cap layer 220 comprising ruthenium or cobalt can be deposited on a copper contact area metal, and a metal cap layer 220 comprising nickel can be deposited on a tungsten or copper contact area metal. In accordance with an embodiment of the present invention, a planarization process, such as, CMP is not needed after deposition of the metal cap layer 220.

Figure 13:
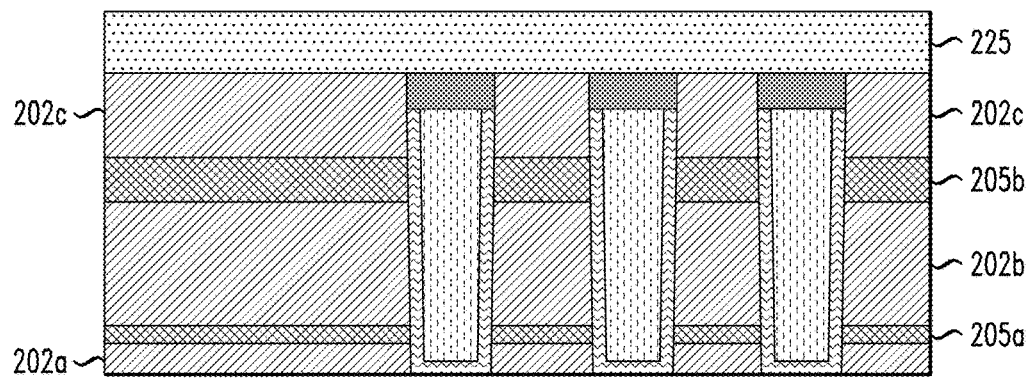
FIG. 13 is a cross-sectional view illustrating deposition of a dielectric layer on the structure including the recessed metal cap layers of FIG. 12 in a method of manufacturing a semiconductor device, according to an exemplary embodiment of the present invention.
Figure 14:
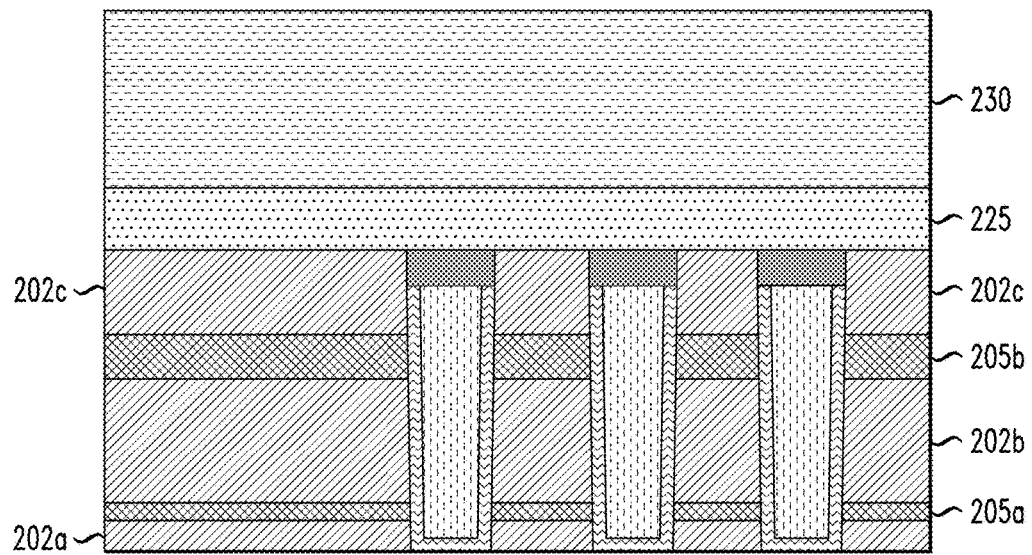
FIG. 14 is a cross-sectional view illustrating deposition of another dielectric layer on the structure including the dielectric layer of FIG. 13 in a method of manufacturing a semiconductor device, according to an exemplary embodiment of the present invention.
Figure 15:
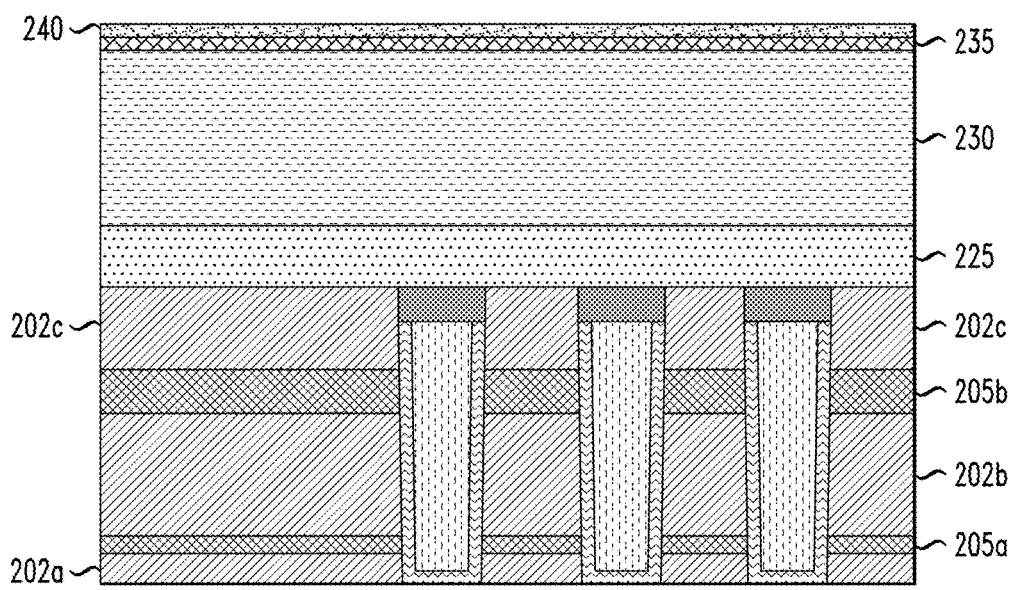
FIG. 15 is a cross-sectional view illustrating deposition of hard mask layers on the structure including the dielectric layers of FIG. 14 in a method of manufacturing a semiconductor device, according to an exemplary embodiment of the present invention.

FIGS. 13-15 illustrate the same or similar steps as those described in connection with FIGS. 4-6, and an explanation of same is not repeated herein. The same or similar reference numbers as those in previous figures are used to denote the same or similar features, elements, or structures as described in connection with the previous figures.

Figure 16:
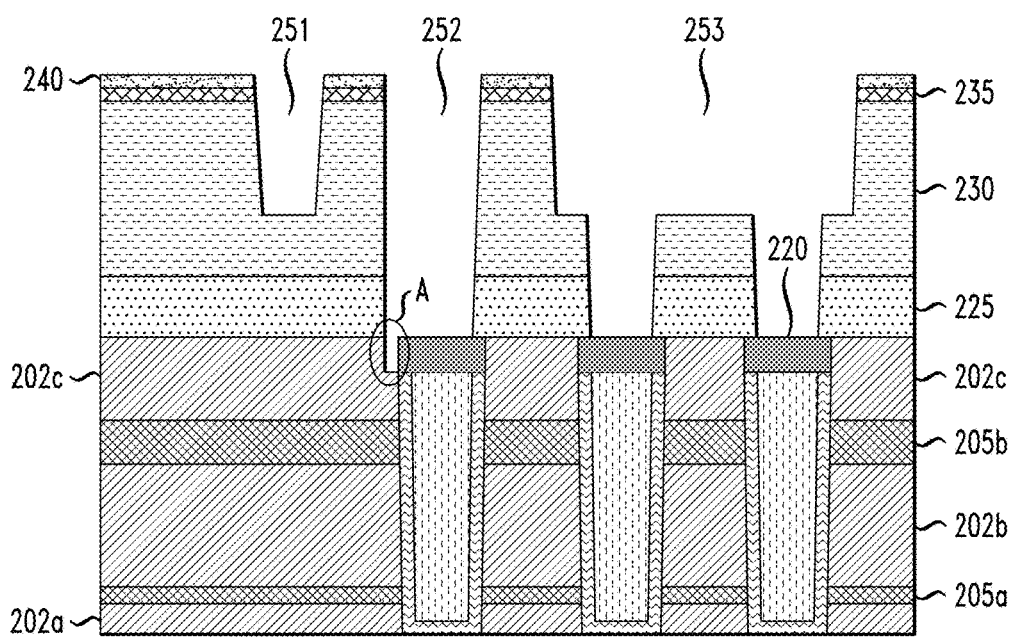
FIG. 16 is a cross-sectional view illustrating formation of openings for a metallization layer in a method of manufacturing a semiconductor device, according to an exemplary embodiment of the present invention.

FIG. 16 is a cross-sectional view illustrating formation of openings for a metallization layer in a method of manufacturing a semiconductor device, according to an exemplary embodiment of the present invention. Referring to FIG. 16, openings 252 and 253 are formed through the layers 225, 230, 235 and 240, exposing the metal cap layers 220. In addition, as shown by circled area A, opening 252 also extends into the oxide layer 202c on the side of the cap layer 220. In the event that an opening extends into a dielectric layer on a side of a contact area, the presence of the recessed cap layer 220 prevents an etchant used during hard mask removal from reaching the contact area metal layer 215 and the barrier layer 217 from the side of the contact area. As a result, unwanted erosion and/or removal of a contact area is also prevented from a side of the contact area, as well as from an upper surface of the contact area.

Like opening 151, opening 251 is formed through the layers 235 and 240, and partially through the layer 230. Like the openings 151, 152 and 153, the openings 251, 252 and 253 are patterned using, for example a lithography and RIE process. As illustrated, patterning of the openings 252 and 253 leaves the metal cap layers 220 exposed during subsequent processing to remove the hard masks 235 and 240. In accordance with an embodiment of the present invention, the presence of the metal cap layers 220 prevents unwanted erosion and/or removal of the contact area metals 215 and barrier films 217 during removal of the hard mask layers 235, 240, and, in particular, during a wet etch process used to remove the TiN hard mask layer 240.

Figure 17:
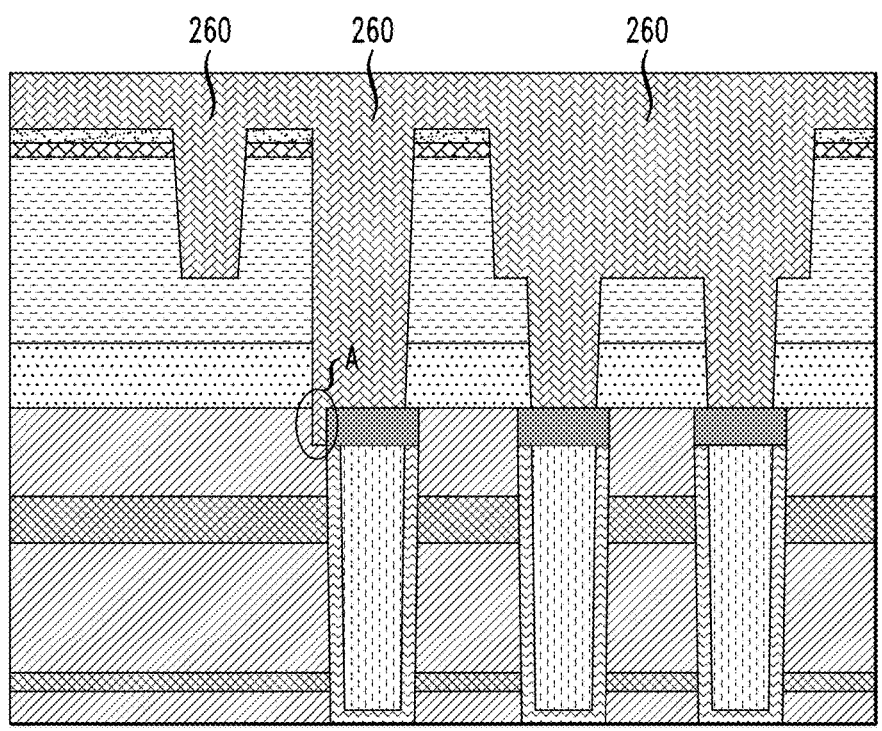
FIG. 17 is a cross-sectional view illustrating deposition of a metallization layer in a method of manufacturing a semiconductor device, according to an exemplary embodiment of the present invention.

With the exception of the metallization layer 260 filling in the additional circled portion A on the side of the leftmost metal cap 220, FIG. 17 illustrates the same or similar steps as those described in connection with FIG. 8, and an explanation of same is not repeated herein. The same or similar reference numbers as those in previous figures are used to denote the same or similar features, elements, or structures as described in connection with the previous figures.

Figure 18:
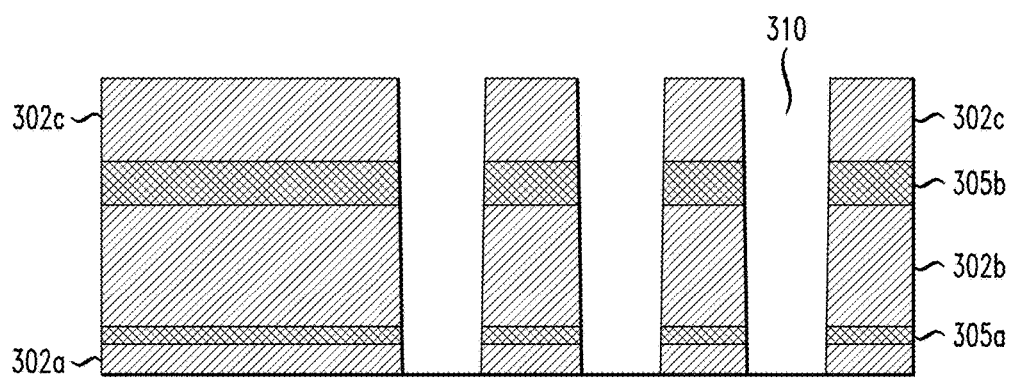
FIG. 18 is a cross-sectional view illustrating removal of portions of stacked dielectric layers to form contact area openings in a method of manufacturing a semiconductor device, according to an exemplary embodiment of the present invention.

FIG. 18 illustrates the same or similar steps as those described in connection with FIGS. 1 and 9, and an explanation of same is not repeated herein. The same or similar reference numbers as those in previous figures are used to denote the same or similar features, elements, or structures as described in connection with the previous figures.

Figure 19:
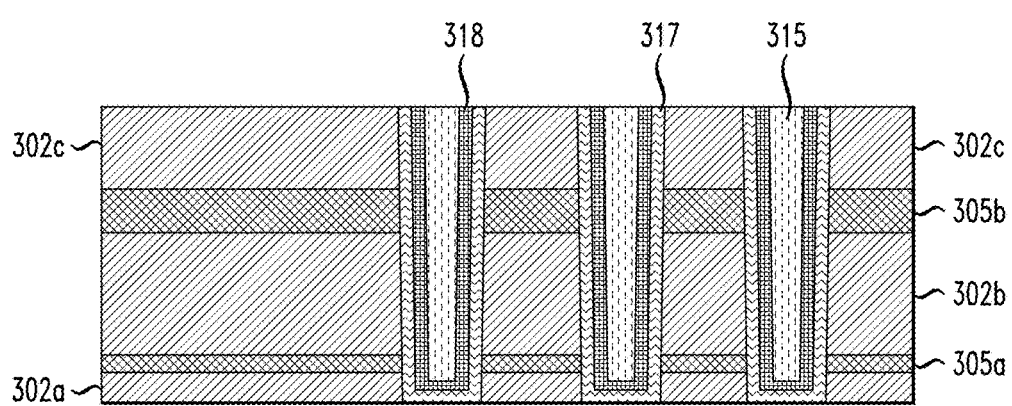
FIG. 19 is a cross-sectional view illustrating deposition of a barrier film, a flash film and contact area metal to form contact areas in a method of manufacturing a semiconductor device, according to an exemplary embodiment of the present invention.
Figure 20:
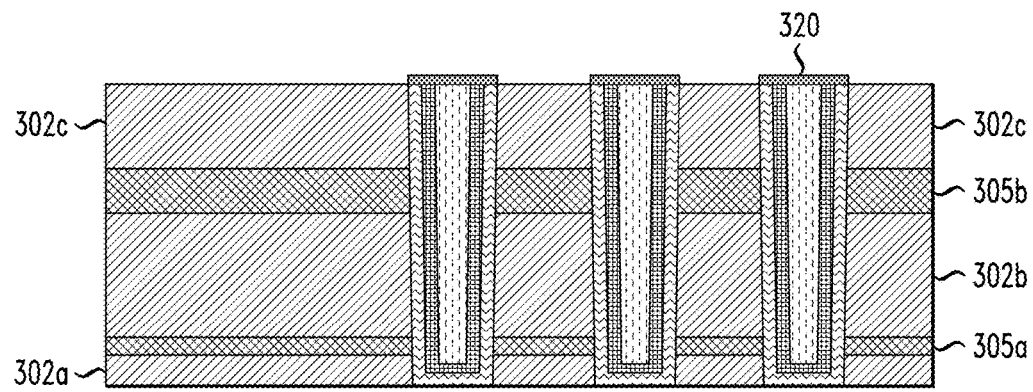
FIG. 20 is a cross-sectional view illustrating deposition of a metal cap layer on each contact area in a method of manufacturing a semiconductor device, according to an exemplary embodiment of the present invention.
Figure 21:
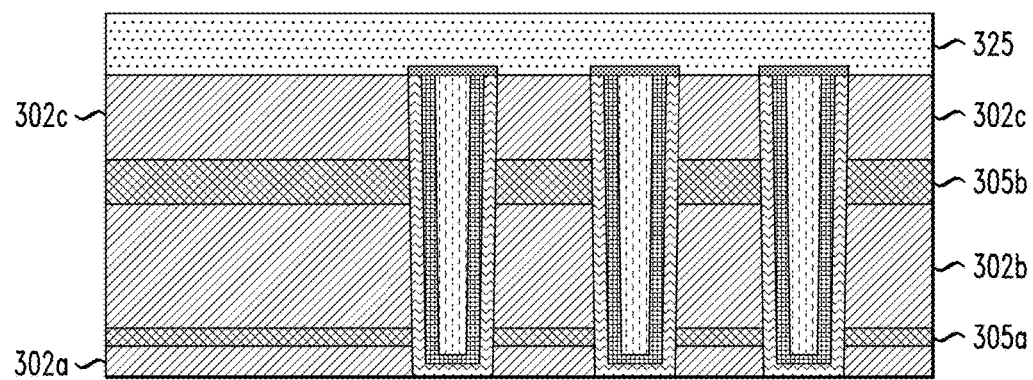
FIG. 21 is a cross-sectional view illustrating deposition of a dielectric layer on the structure including the metal cap layers of FIG. 20 in a method of manufacturing a semiconductor device, according to an exemplary embodiment of the present invention.
Figure 22:
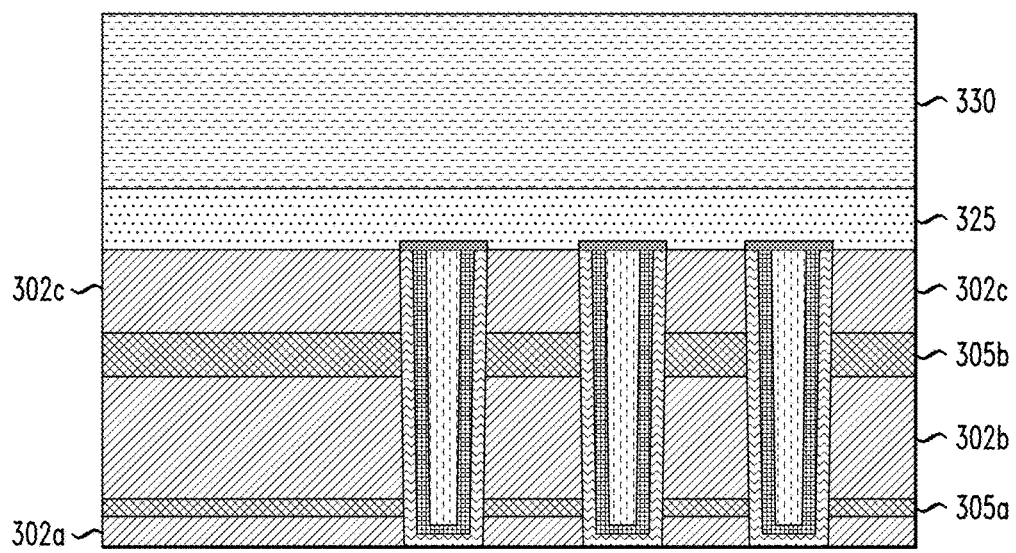
FIG. 22 is a cross-sectional view illustrating deposition of another dielectric layer on the structure including the dielectric layer of FIG. 21 in a method of manufacturing a semiconductor device, according to an exemplary embodiment of the present invention.
Figure 23:
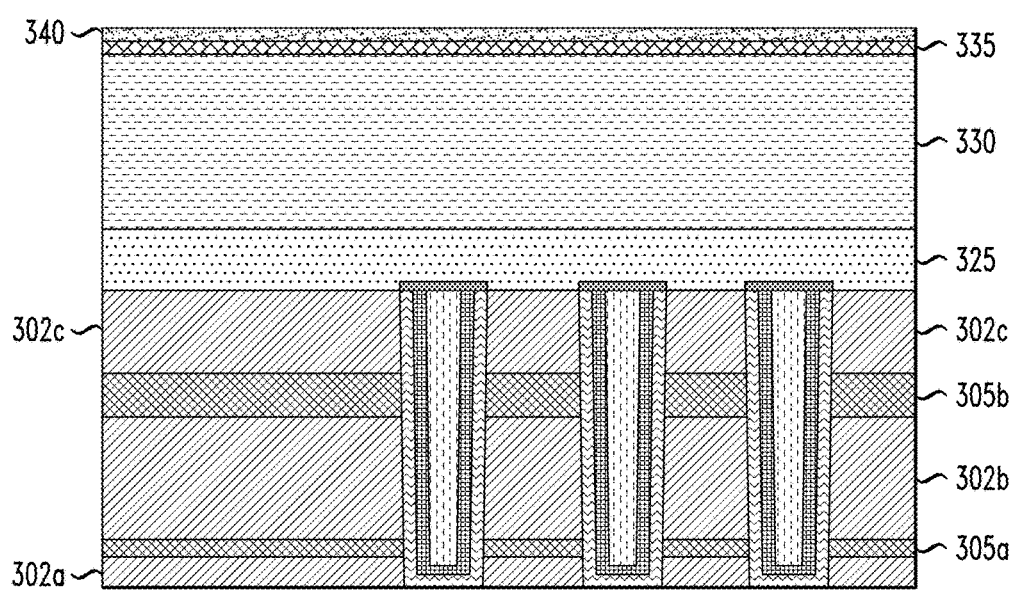
FIG. 23 is a cross-sectional view illustrating deposition of hard mask layers on the structure including the dielectric layers of FIG. 22 in a method of manufacturing a semiconductor device, according to an exemplary embodiment of the present invention.

FIG. 19 is a cross-sectional view illustrating deposition of a barrier film, a flash film and contact area metal to form contact areas in a method of manufacturing a semiconductor device, according to an exemplary embodiment of the present invention. Referring to FIG. 19, the openings 310 are filled with a contact area metal 315, such as, for example, tungsten (W) or cobalt (Co). Prior to depositing the contact area metal 315, the opening 310 is lined on sides and a bottom thereof with a barrier film 317, and a flash film 318 is conformally deposited on the barrier film 317 on sides and a bottom of the opening 310. The flash film 318 surrounds the contact area metal 315 once the contact area metal 315 is deposited. Like the barrier film 117, the barrier film 317 can include, but is not necessarily limited to, titanium (Ti) or titanium nitride (TiN). According to an embodiment, if the contact area metal 315 is cobalt, the flash film 318 comprises ruthenium, and if the contact area metal 315 comprises tungsten, the flash film 318 comprises cobalt. A horizontal thickness of the flash film 318 on the barrier layer 317 can be in the range of about 2 nm to about 5 nm.

The contact area metal 315, barrier film 317 and flash film 318 can be deposited using deposition techniques including, but not limited to, CVD, PECVD, RFCVD, PVD, ALD, MBD, PLD, and/or LSMCD, sputtering, and/or plating, followed by a planarization process, such as, CMP to remove excess contact area metal and barrier and flash film materials. Referring to FIG. 19, the resulting structure has a planarized top surface.

FIGS. 20-23 illustrate the same or similar steps as those described in connection with FIGS. 3-6, and an explanation of same is not repeated herein. The same or similar reference numbers as those in previous figures are used to denote the same or similar features, elements, or structures as described in connection with the previous figures.

Figure 24:
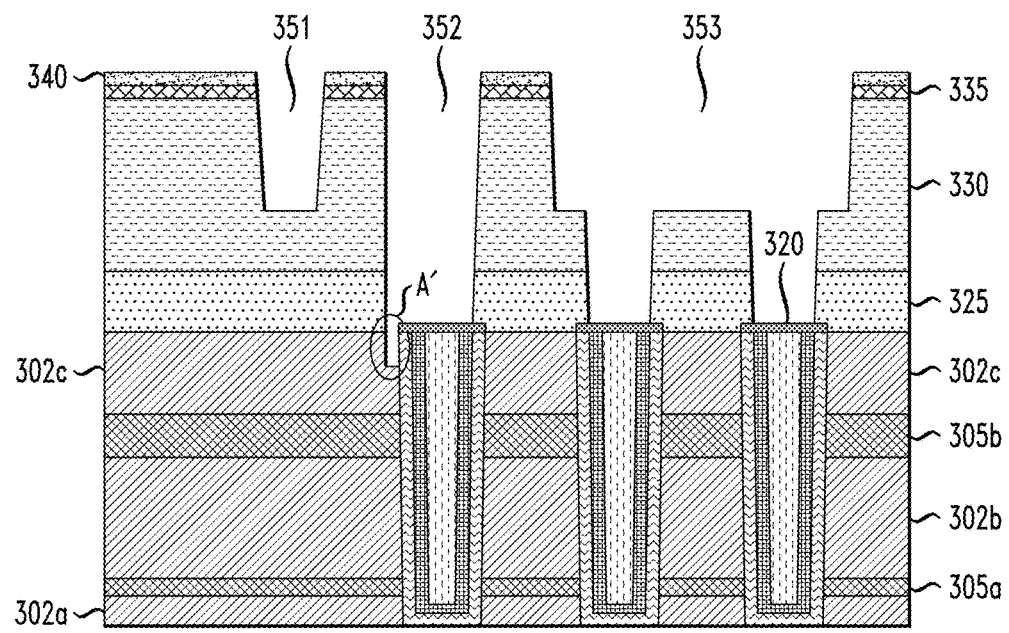
FIG. 24 is a cross-sectional view illustrating formation of openings for a metallization layer in a method of manufacturing a semiconductor device, according to an exemplary embodiment of the present invention.

FIG. 24 is a cross-sectional view illustrating formation of openings for a metallization layer in a method of manufacturing a semiconductor device, according to an exemplary embodiment of the present invention. Referring to FIG. 24, openings 352 and 353 are formed through the layers 325, 330, 335 and 340, exposing the metal cap layers 320. In addition, as shown by circled area A', opening 352 also extends into the oxide layer 302c on the side of the barrier and flash films 317, 318. In the event that an opening extends into a dielectric layer on a side of a contact area, the presence of the flash film 318, as well as the barrier film 317 prevent an etchant used during hard mask removal from reaching the contact area metal layer 315 from the side of the contact area. As a result, unwanted erosion and/or removal of the contact area metal layer 315 is also prevented from a side of the contact area, as well as from an upper surface of the contact area.

Like opening 151, opening 351 is formed through the layers 335 and 340, and partially through the layer 330. Like the openings 151, 152 and 153, the openings 351, 352 and 353 are patterned using, for example a lithography and RIE process. As illustrated, patterning of the openings 352 and 353 leaves the metal cap layers 320 exposed during subsequent processing to remove the hard masks 335 and 340. In accordance with an embodiment of the present invention, the presence of the metal cap layers 320 and of flash films 318 prevents unwanted erosion and/or removal of the contact area metals 315 during removal of the hard mask layers 335, 340, and, in particular, during a wet etch process used to remove the TiN hard mask layer 340.

Figure 25:
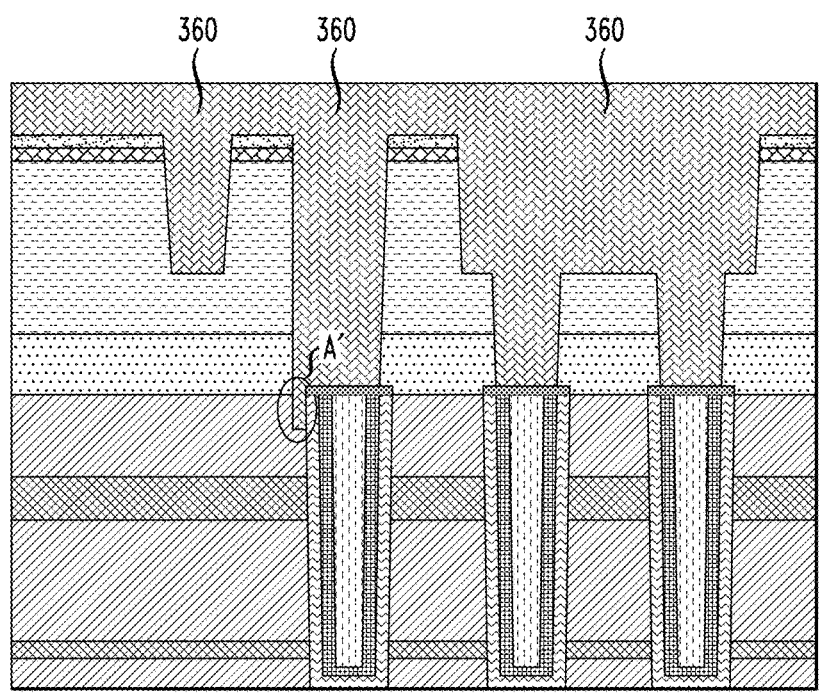
FIG. 25 is a cross-sectional view illustrating deposition of a metallization layer in a method of manufacturing a semiconductor device, according to an exemplary embodiment of the present invention.

With the exception of the metallization layer 360 filling in the additional circled portion A' on the side of the leftmost contact area, FIG. 25 illustrates the same or similar steps as those described in connection with FIG. 8, and an explanation of same is not repeated herein. The same or similar reference numbers as those in previous figures are used to denote the same or similar features, elements, or structures as described in connection with the previous figures.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a contact area opening in a dielectric structure;
    depositing a contact area metal in the contact area opening;
    forming a metal cap layer on the contact area metal;
    forming one or more dielectric layers on the metal cap layer;
    forming one or more hard mask layers on the one or more dielectric layers;
    forming a metallization opening through the one or more dielectric and hard mask layers, wherein the metallization opening exposes the metal cap layer;
    removing the one or more hard mask layers; and
    forming a metallization layer in the metallization opening on the metal cap layer;
    wherein the contact area metal comprises cobalt and the metal cap layer comprises ruthenium.

2. The method according to claim 1, wherein the dielectric structure comprises a plurality of dielectric layers in a stacked configuration.

3. The method according to claim 1, wherein the ruthenium is deposited using chemical vapor deposition.

4. A method for manufacturing a semiconductor device, comprising:
    forming a contact area opening in a dielectric structure;
    depositing a contact area metal in the contact area opening;
    forming a metal cap layer on the contact area metal;
    forming one or more dielectric layers on the metal cap layer;
    forming one or more hard mask layers on the one or more dielectric layers;
    forming a metallization opening through the one or more dielectric and hard mask layers, wherein the metallization opening exposes the metal cap layer;
    removing the one or more hard mask layers; and forming a metallization layer in the metallization opening on the metal cap layer;
wherein the contact area metal comprises tungsten and the metal cap layer comprises cobalt.

5. The method according to claim 4, wherein the cobalt is deposited using chemical vapor deposition.

6. A method for manufacturing a semiconductor device, comprising:
forming a contact area opening in a dielectric structure;
depositing a contact area metal in the contact area opening;
forming a metal cap layer on the contact area metal;
forming one or more dielectric layers on the metal cap layer;
forming one or more hard mask layers on the one or more dielectric layers;
forming a metallization opening through the one or more dielectric and hard mask layers, wherein the metallization opening exposes the metal cap layer;
removing the one or more hard mask layers;
forming a metallization layer in the metallization opening on the metal cap layer;
planarizing the contact area metal on the dielectric structure after depositing the contact area metal in the contact area opening; and
removing an upper portion of the contact area metal from the contact area opening to form a recessed area in the contact area opening.

7. The method according to claim 6, wherein a depth of the recessed area from a top surface of the dielectric structure is in a range of about 3 nm to about 10 nm.

8. The method according to claim 6, wherein the metal cap layer is formed in the recessed area.

9. The method according to claim 8, wherein the metallization opening extends into the dielectric structure along a side of the metal cap layer.

10. The method according to claim 1, further comprising depositing a flash film in the contact area opening prior to depositing the contact area metal in the contact area opening, wherein the flash film is deposited on sides and a bottom of the contact area opening.

11. A method for manufacturing a semiconductor device, comprising:
forming a contact area opening in a dielectric structure;
depositing a contact area metal in the contact area opening;
forming a metal cap layer on the contact area metal;
forming one or more dielectric layers on the metal cap layer;
forming one or more hard mask layers on the one or more dielectric layers;
forming a metallization opening through the one or more dielectric and hard mask layers, wherein the metallization opening exposes the metal cap layer;
removing the one or more hard mask layers;
forming a metallization layer in the metallization opening on the metal cap layer; and
depositing a flash film in the contact area opening prior to depositing the contact area metal in the contact area opening, wherein the flash film is deposited on sides and a bottom of the contact area opening;
wherein the contact area metal comprises cobalt and the flash film comprises ruthenium.

12. A method for manufacturing a semiconductor device, comprising:
forming a contact area opening in a dielectric structure;
depositing a contact area metal in the contact area opening;
forming a metal cap layer on the contact area metal;
forming one or more dielectric layers on the metal cap layer;
forming one or more hard mask layers on the one or more dielectric layers;
forming a metallization opening through the one or more dielectric and hard mask layers, wherein the metallization opening exposes the metal cap layer;
removing the one or more hard mask layers;
forming a metallization layer in the metallization opening on the metal cap layer; and
depositing a flash film in the contact area opening prior to depositing the contact area metal in the contact area opening, wherein the flash film is deposited on sides and a bottom of the contact area opening;
wherein the contact area metal comprises tungsten and the flash film comprises cobalt.

13. A method for manufacturing a semiconductor device, comprising:
forming a contact area opening in a dielectric structure;
depositing a contact area metal in the contact area opening;
forming a metal cap layer on the contact area metal;
forming one or more dielectric layers on the metal cap layer;
forming one or more hard mask layers on the one or more dielectric layers;
forming a metallization opening through the one or more dielectric and hard mask layers, wherein the metallization opening exposes the metal cap layer;
removing the one or more hard mask layers;
forming a metallization layer in the metallization opening on the metal cap layer; and
depositing a flash film in the contact area opening prior to depositing the contact area metal in the contact area opening, wherein the flash film is deposited on sides and a bottom of the contact area opening;
wherein a thickness of the flash film is in a range of about 2 nm to about 5 nm.

14. A method for manufacturing a semiconductor device, comprising:
forming a contact area opening in a dielectric structure;
depositing a contact area metal in the contact area opening;
forming a metal cap layer on the contact area metal;
forming one or more dielectric layers on the metal cap layer;
forming one or more hard mask layers on the one or more dielectric layers;
forming a metallization opening through the one or more dielectric and hard mask layers, wherein the metallization opening exposes the metal cap layer;
removing the one or more hard mask layers;
forming a metallization layer in the metallization opening on the metal cap layer; and
depositing a flash film in the contact area opening prior to depositing the contact area metal in the contact area opening, wherein the flash film is deposited on sides and a bottom of the contact area opening;
wherein the metallization opening extends into the dielectric structure along a side of the contact area opening comprising the flash film.

15. A semiconductor device, comprising:
a contact area opening in a dielectric structure;
a contact area metal formed in the contact area opening;

a metal cap layer on the contact area metal;

one or more dielectric layers on the dielectric structure;

a metallization opening formed through the one or more dielectric layers, wherein the metallization opening extends to the metal cap layer;

a metallization layer in the metallization opening contacting the metal cap layer; and a recessed area in the contact area opening, wherein the metal cap layer is formed in the recessed area.

16. The semiconductor device according to claim 15, wherein the metallization opening extends into the dielectric structure along a side of the metal cap layer.

17. The semiconductor device according to claim 15, further comprising a flash film on sides and a bottom of the contact area opening around the contact area metal, wherein the metallization opening extends into the dielectric structure along a side of the contact area opening comprising the flash film.

18. A method for manufacturing a semiconductor device, comprising:

forming a plurality of contact area openings in a dielectric structure;

depositing a contact area metal in each of the contact area openings;

forming a metal cap layer on each of the contact area metals;

forming one or more dielectric layers on the metal cap layers;

forming one or more hard mask layers on the one or more dielectric layers;

forming a plurality of metallization openings through the one or more dielectric and hard mask layers, wherein the metallization openings expose each of the metal cap layers;

removing the one or more hard mask layers; and forming a metallization layer in each of the metallization openings on the metal cap layers.

* * * * *